US012787239B2

(12) United States Patent
Gollakota et al.

(10) Patent No.: US 12,787,239 B2
(45) Date of Patent: Nov. 3, 2026

(54) ELECTROMAGNETIC SHIELDS AND METHODS OF USE THEREFOR

(71) Applicant: HONEYWELL INTERNATIONAL INC., Charlotte, NC (US)

(72) Inventors: Sai Manohar Gollakota, Bangalore (IN); Hima Bindu Kocherla, Bangalore (IN); Swathi Kosanam, Bangalore (IN)

(73) Assignee: HONEYWELL AEROSPACE US LLC, Phoenix, AZ (US)

( * ) Notice: Subject to any disclaimer, the term of this patent is extended or adjusted under 35 U.S.C. 154(b) by 123 days.

(21) Appl. No.: 18/826,312

(22) Filed: Sep. 6, 2024

(65) Prior Publication Data

US 2026/0006762 A1 Jan. 1, 2026

(30) Foreign Application Priority Data

Jun. 27, 2024 (IN) ............................. 202411049303

(51) Int. Cl.
*H05K 9/00* (2006.01)

(52) U.S. Cl.
CPC ......... *H05K 9/0083* (2013.01); *H05K 9/0064* (2013.01); *H05K 9/0088* (2013.01)

(58) Field of Classification Search
CPC .................................................... H05K 9/0083
See application file for complete search history.

(56) References Cited

U.S. PATENT DOCUMENTS 8,999,453 B2 4/2015 Shah et al.
9,241,433 B2 1/2016 Shah et al.
9,574,300 B2 2/2017 Shah et al.
2013/0063296 A1* 3/2013 Hennig ................ H01Q 17/004 342/1
2015/0159027 A1 6/2015 Chu et al.
2018/0077828 A1* 3/2018 Braley .................... C23C 28/34

FOREIGN PATENT DOCUMENTS

CN 208159121 U 11/2018
CN 117344549 A 1/2024
WO 2023060739 A1 4/2023

OTHER PUBLICATIONS

XP093335111; Biswas Sourav et al: “Absorption-Dominated Electromagnetic Wave Suppressor Derived from Ferrite-Doped Cross-Linked Graphene Framework and Conducting Carbon”, ACS Applied Materials & Interfaces, vol. 9, No. 3, Jan. 13, 2017 (Jan. 13, 2017), pp. 3030-3039, United States ISSN: 1944-8244, DOI: 10.1021/acsami.6b14853 Retrieved from the Internet: URL:https://pubs.acs.org/doi/pdf/10.1021/a csami.6b14853> * abstract * * examples * * figure 5 * * table 1 *.

* cited by examiner

*Primary Examiner* — Hung V Ngo
(74) *Attorney, Agent, or Firm* — Ingrassia Fisher & Lorenz

(57) ABSTRACT

Electromagnetic shields and methods are provided for electromagnetic shielding. The electromagnetic shields include a first material configured for reflection and/or absorption of electromagnetic radiation and that includes a polymer matrix with magnetic and/or conductive nanoparticles dispersed therein. The electromagnetic shield may be provided between a source of electromagnetic radiation and an object to provide the electromagnetic shielding to the object.

20 Claims, 2 Drawing Sheets

ELECTROMAGNETIC SHIELDS AND METHODS OF USE THEREFOR

CROSS REFERENCE TO RELATED APPLICATION

This application claims priority to India Provisional Patent Application No. 202411049303, filed Jun. 27, 2024, the entire content of which is incorporated by reference herein.

TECHNICAL FIELD

The present invention generally relates to electromagnetic interference shielding, and more particularly relates to electromagnetic shields that include magnetic nanoparticles and/or conductive nanoparticles embedded in polymeric matrices.

BACKGROUND

Many electronic components require electromagnetic interference (EMI) shielding to reduce or prevent interference from strong electromagnetic fields that could disrupt sensitive devices and signals. EMI shielding operates based on either reflecting or absorbing incoming electromagnetic radiation. The conductivity of materials determines the extent of reflection, while resonances, such as magnetic properties, contribute to absorption. The overall effectiveness of EMI shielding is the sum of these two factors. Metals, due to their high electrical conductivity, are commonly used for this purpose. Currently, solid aluminum sheets are commonly employed for shielding; however, they are relatively heavy which may reduce their potential in certain applications. For example, weight is typically an important consideration in aerospace applications, especially with the current transition towards more sustainable platforms such as electric vehicles. While alternatives like metal mesh have shown promising attenuation at lower frequencies, their effectiveness diminishes rapidly at higher frequencies.

Hence, there is a need for systems and methods capable of providing EMI shielding while reducing the drawbacks of existing systems. Furthermore, other desirable features and characteristics of the present invention will become apparent from the subsequent detailed description and the appended claims, taken in conjunction with the accompanying drawings and the foregoing technical field and background.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In various examples, an electromagnetic shield is provided that includes a first material configured for reflection and/or absorption of electromagnetic radiation and that includes a polymer matrix with magnetic nanoparticles dispersed therein. In some examples, the first material may include conductive nanoparticles.

In various examples, a method is provided for electromagnetic shielding that includes providing an electromagnetic shield between a source of electromagnetic radiation and an object, wherein the electromagnetic shield includes a first material configured for reflection and/or absorption of electromagnetic radiation that includes a polymer matrix with magnetic nanoparticles dispersed therein. In some examples, the first material may include conductive nanoparticles.

Furthermore, other desirable features and characteristics of the electromagnetic shield and the method will become apparent from the subsequent detailed description and the appended claims, taken in conjunction with the accompanying drawings and the preceding background.

BRIEF DESCRIPTION OF DRAWINGS

The present disclosure will hereinafter be described in conjunction with the following drawing figures, wherein like numerals denote like elements, and wherein.

DETAILED DESCRIPTION

Figure 1:
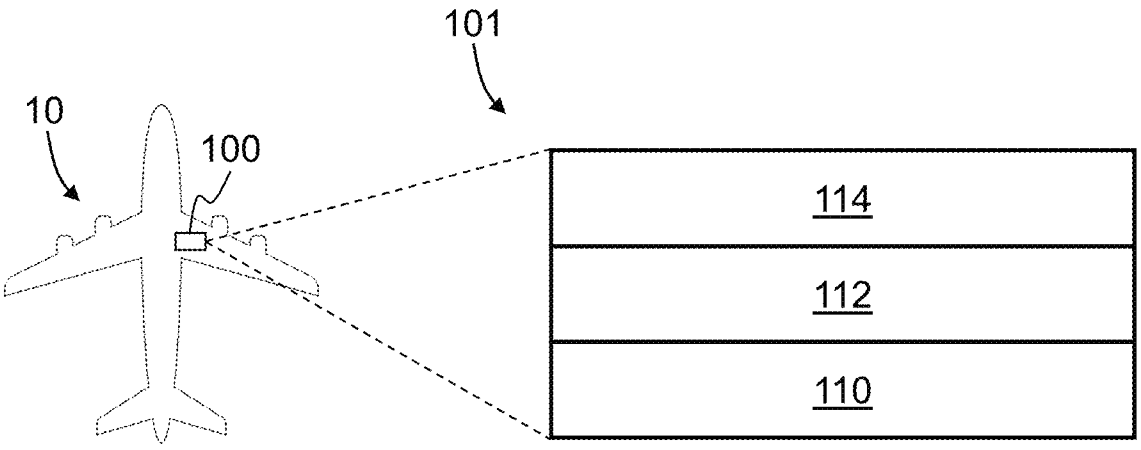
FIG. 1 schematically represents a first mobile platform and a first electromagnetic shield thereof in accordance with an embodiment.
Figure 2:
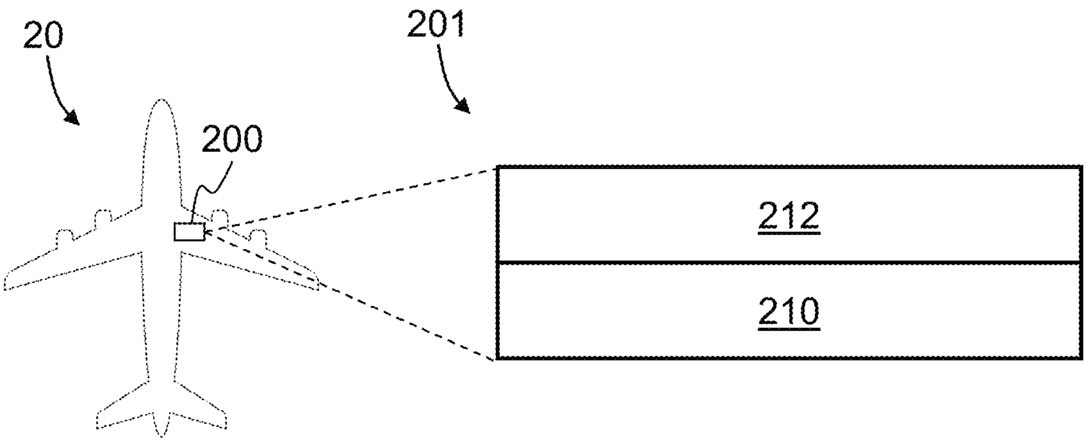
FIG. 2 schematically represents a second mobile platform and a second electromagnetic shield thereof in accordance with an embodiment.

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Systems and methods disclosed herein provide for electromagnetic interference (EMI) shielding of electronic devices, such as various electronic devices onboard a mobile platform. The systems and methods may include relatively lightweight materials that provide significant EMI protection, and in some examples, are capable of being tailored to provide predetermined amounts of electromagnetic radiation reflection and absorption.

In various examples, the systems and methods provide for an EMI shield having a body configured to reduce or eliminate transmission of electromagnetic radiation therethrough by reflection and/or absorption of the electromagnetic radiation. The EMI may include a single layer formed of a single material, or two or more layers including two or more materials. In various examples, the EMI shield includes at least a first material that includes a polymer matrix having nanoparticles dispersed therein that are configured to reflect and/or absorb electromagnetic radiation. With such an arrangement, the first material is capable of providing EMI shielding while having significantly less weight relative to, for example, existing metallic EMI shields. When installed to provide protection to an electronic device, the EMI shield may be electrically grounded.

In some examples, the first material includes nanoparticles having magnetic properties, that are configured to provide electromagnetic radiation absorption properties to the first material. For example, the first material may include nanoparticles having magnetic properties dispersed and embedded within the polymer matrix. The magnetic nanoparticles may include compositions including iron oxide, manganese oxide, nickel oxide, or other materials or combinations of materials that provide magnetic properties. In some examples, the magnetic nanoparticles include multi-walled carbon nanotube/manganese oxide nanoparticles, cross-linked partially reduced graphene oxide/iron oxide nanoparticles, or both dispersed and embedded in the polymer matrix. In some examples, the magnetic nanoparticles are formed of materials having a near superparamagnetic nature (e.g., coercivity close to zero, such as about 1 to 80 Oe). In some examples, the magnetic nanoparticles have particle sizes of less than 150 nm, such as 1 to 150 nm, in at least one of the three spatial dimensions.

In some examples, the first material includes nanoparticles having relatively high conductivity sufficient to provide electromagnetic radiation reflection properties to the first material. For example, the first material may include nanoparticles having compositions including various metallic materials, carbon materials, or other materials or combinations of materials that provide conductive properties dispersed and embedded within the polymer matrix. In some examples, the conductive nanoparticles include multiwalled carbon nanotubes, graphene, or both. In some examples, the conductive nanoparticles are formed of materials having a conductivity of at least $10^2$ S/m. In some examples, the conductive nanoparticles have particle sizes of less than 150 nm, such as 1 to 150 nm, in at least one of the three spatial dimensions.

In some examples, the first material may include one or more additional additives configured to promote other properties thereof. For example, the first material may include a reinforcement material, such as reinforcing fibers dispersed and embedded within the polymer matrix. In some examples, the first material may include carbon fibers, glass fibers, and/or various synthetic fibers (e.g., aramid fibers such as Kevlar®).

The matrix may include various polymeric and elastomeric materials such as, but not limited to, acrylonitrile butadiene styrene (ABS), polyamide-imide (PAI), polyimide (PI), bismaleimide (BMI), polyether ether ketone (PEEK), polyamides (e.g., nylon), urethanes, silicon rubbers, rubbers, polytetrafluoroethylene (PTFE), fluorosilicone (FVMQ) rubbers, diallyl phthalate resin, polycarbonate (PC), methyl phenyl vinyl silicone (PVMQ), butadiene-acrylonitrile synthetic (NBR), ethylene-propylene ter-polymer, ethylene-propylene co-polymer, fluorocarbon (FKM) rubber, para aramid, polysulfide, BMI/epoxy, epoxy/phenolic, phenolic, polyoxymethylene, acrylic alkyd, polyurethane, polyester, methyl/methyl vinyl silicone (MQ/VMQ), polyethylene and copolymers, polysulfone, acetal (POM), polyvinyl chloride, polyetherimide (PEI), poly(N,N'-p-p'-oxydiphenylene, pyromellitimide), ethylene propylene, polyamide-imide (PAI), acrylic, acrylonitrile-butadiene (NBR), vinyl-methyl silicone (VMQ).

In some examples, the first material includes a polymer matrix having at least 0.1 wt. % of the magnetic nanoparticles, such about 0.1 wt. % to about 30 wt. %, such as about 0.5 wt. % to about 50 wt. %. In some examples, the first material includes a polymer matrix having at least 0.1 wt. % of the conductive nanoparticles, such about 0.1 wt. % to about 30 wt. %, such as about 0.5 wt. % to about 50 wt. %. In some examples, the first material includes a polymer matrix having at least 5 wt. % of the reinforcing fibers, such about 5 to about 60 wt. %, such as about 10 to about 50 wt. %.

For examples that include the systems and methods used onboard a mobile platform, the mobile platform may be any type of vehicle, such as but not limited to various types of aircraft. It should be noted that the term aircraft, as utilized herein, may include any manned or unmanned object capable of flight. Examples of aircraft may include, but are not limited to, fixed-wing aerial vehicles (e.g., propeller-powered or jet powered), rotary-wing aerial vehicles (e.g., helicopters), manned aircraft, unmanned aircraft (e.g., unmanned aerial vehicles, or UAVs), delivery drones, etc. For convenience, the systems and methods will be described in reference to a manned airplane; however, as noted the systems and methods are not limited to such application, nor are the systems and methods limited to mobile platforms in general.

Referring now to FIG. 1, an aircraft 10, in this example an airplane, is provided that includes at least one EMI shield 100 configured to reduce electromagnetic interference from a source of electromagnetic radiation to an electronic device onboard the aircraft 10. The EMI shield 100 may have various shapes and sizes, and is not limited to any particular structure. In this example, the EMI shield 100 includes a multilayer structure 101 including a first layer 110, a second layer 112 on the first layer 110, and a third layer 114 on the second layer 112. The first layer 110 may be configured to face the electronic device that is to be shielded, and the third layer 114 may be configured to face away from the electronic device and/or toward the source of electromagnetic radiation. Therefore, the first layer 110 may also be referred to as the inner layer 110, the second layer 112 may also be referred to as the middle layer 112, and the third layer 114 may also be referred to as the outer layer 114.

The inner layer 110, the middle layer 112, and the outer layer 114 may each provide various properties to the EMI shield 100, promote various functions to the EMI shield 100, and/or include various materials. In some examples, the inner layer 110 and the outer layer 114 are both configured to promote absorption of electromagnetic radiation, and the middle layer 112 is configured to promote reflection of electromagnetic radiation. While not intending to be bond to any particular theory, it is believed that this arrangement provides significant EMI shielding capabilities relative to the thickness and weight of the EMI shield 100.

In some examples, the inner layer 110 is formed of or includes a first material having magnetic nanoparticles dispersed within a polymeric matrix, and optionally conductive nanoparticles dispersed within the polymeric matrix, the middle layer 112 is formed of or includes a second material that includes conductive nanoparticles dispersed within a polymeric matrix, and the outer layer 114 is formed of or includes a third material having magnetic nanoparticles dispersed within a polymeric matrix, and optionally conductive nanoparticles dispersed within the polymeric matrix. In some examples, the first material and the second material have the same composition, similar compositions, and/or include the same or similar nanoparticles. In some examples, the polymer matrices of the first, second, and third materials are formed of the same material.

In various examples, the first and third materials include multiwalled carbon nanotube/manganese oxide nanoparticles, cross-linked partially reduced graphene oxide/iron oxide nanoparticles, or both dispersed and embedded in a polymer matrix. Optionally, the first and third materials may include reinforcing fibers dispersed and embedded within the polymer matrix. In various examples, the second material includes multiwalled carbon nanotubes, graphene/graphene nanoplatelets/few-layer graphene/multi-layer graphene, metallic nanoparticles or combinations thereof.

In various examples, the inner layer 110, the middle layer 112, and the outer layer 114 each have a thickness of at least 100 nm, such as about 100 nm to about 10,000 micrometers, such as about 500 nm to about 10,000 micrometers.

Referring now to FIG. 1, another aircraft 20 is provided that includes another EMI shield 200 that is configured to reduce electromagnetic interference from a source of electromagnetic radiation to an electronic device, such as onboard an aircraft. In this example, the EMI shield 200 includes multilayer structure 201 including a first layer 210 and a second layer 212 on the first layer 210. The EMI shield 200 may have various shapes and sizes, and is not limited to any particular structure. The first layer 210 may be configured to face the electronic device that is to be shielded, and the second layer 212 may be configured to face away from the electronic device and/or toward the source of electromagnetic radiation. In this example, the first layer 210 is also referred to as a substrate layer 210, and the second layer 212 is also referred to as a coating layer 212.

In various examples, the substrate layer 210 may be formed of or include various materials such as certain metallic materials. In some examples, the substrate layer 210 is formed of or includes aluminum or an alloy thereof.

In various examples, the coating layer 212 may be formed of or include various coating materials formed or deposited on a surface of the substrate layer 210 that are configured to promote absorption or reflection of electromagnetic radiation. In some examples, the coating layer 212 is formed of or includes a first material having magnetic nanoparticles dispersed within a polymeric matrix, optionally conductive nanoparticles dispersed within the polymeric matrix, and optionally reinforcing fibers dispersed within the polymeric matrix. In some examples, the coating layer 212 is formed of or includes a first material having multiwalled carbon nanotube/manganese oxide nanoparticles, cross-linked partially reduced graphene oxide/iron oxide nanoparticles, or both dispersed and embedded in a polymer matrix. Optionally, the first material of the coating layer 212 may include multiwalled carbon nanotubes, graphene, or both. In some examples, the coating layer 212 have a thickness of at least 100 nm, such as about 100 nm to about 1000 micrometers, such as about 100 nm or more.

In various examples, the EMI shield, such as the EMI shields 100, 200, may include a material having both magnetic nanoparticles and conductive nanoparticles, and the amounts or ratios of the magnetic nanoparticles and the conductive nanoparticles may be tailored to provide a predetermined amount of absorption and reflection therefrom, respectively, as will be discussed in more detail below.

Figure 3:
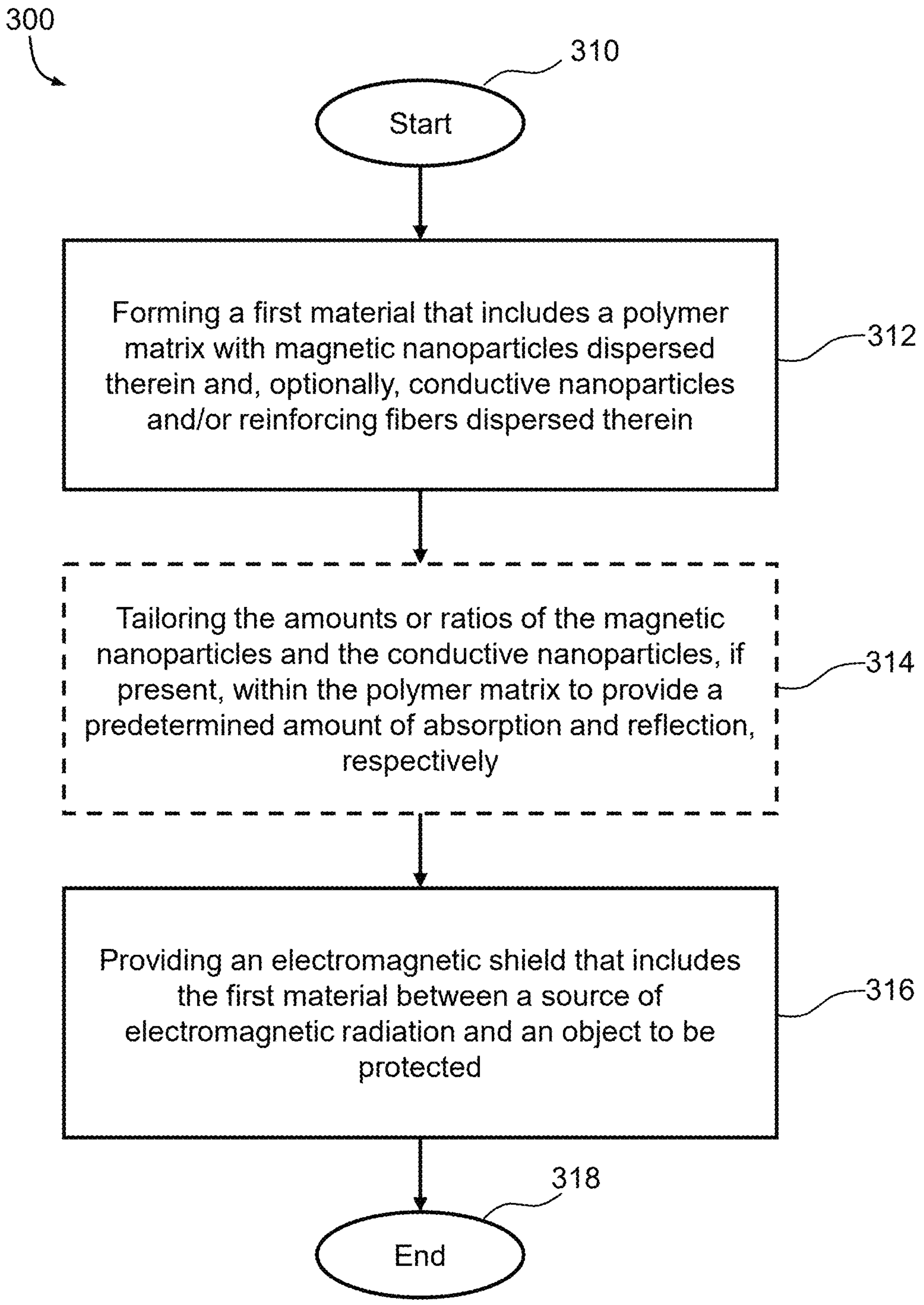
FIG. 3 is a flowchart illustrating an exemplary method for providing electromagnetic shielding to an electronic device in accordance with an embodiment.

The systems disclosed herein, including systems comprising the EMI shield 100 and/or the EMI shield 200, provide for methods of providing EMI shielding to electronic devices. For example, FIG. 3 is a flowchart illustrating an exemplary method 300 for providing shielding from electromagnetic radiation. The method 300 may start at 310.

At 312, the method 300 may include forming a first material that includes a polymer matrix with magnetic nanoparticles dispersed therein and, optionally, conductive nanoparticles and/or reinforcing fibers dispersed therein.

In various examples, the first material may be formed to include hybrid, multiwalled carbon nanotube/manganese oxide (MWCNT-$MnO_2$) nanoparticles dispersed in a polymer matrix. The MWCNT-$MnO_2$ nanoparticles may be formed by various processes. In one example, synthesis of the MWCNT-$MnO_2$ nanoparticles may include preparing carboxyl acid functionalized MWCNTs by a harsh acid treatment with nitric acid ($HNO_3$). The dried acid functionalized MWCNTs (e.g., 100 mg) may be redispersed in water (e.g., 100 mL) by, for example, bath sonication. Manganese sulfate (e.g., 1 mmol) may be added, and the solution may be stirred at a reduced temperature (e.g., for about ten minutes in an ice bath). Meanwhile, L arginine (e.g., 20 mmol) may be separately dissolved in deionized water (e.g., 40 mL). The L arginine solution may then be added to the solution containing the manganese sulfate and the MWCNTs. The resulting solution may be maintained at a substantially constant reduced temperature (e.g., about 10° C.) and stirred (e.g., about three hours). Afterward, the solution may be centrifuged and the remaining nanoparticles may be washed with ethanol. The obtained hybrid nanoparticles may be dried (e.g., about 80° C.).

In various examples, the first material may be formed to include 3,4-methylenedioxyamphetamine cross-linked partially reduced graphene oxide/iron oxide (MDA modified r-GO/Fe) nanoparticles dispersed in a polymer matrix. The MDA modified r-GO/Fe nanoparticles may be formed by various processes. In one example, the synthesis of the MDA modified r-GO/Fe nanoparticles includes attaching MDA molecules to surfaces of graphene oxide by, for example, refluxing the graphene oxide with MDA in a dimethylformamide (DMF) solution (e.g., at about 105° C. for about 24 hours). The resulting dry powder of MDA-GO (e.g., 20 mg) may be redispersed in deionized (DI) water (e.g., 20 mL). Meanwhile, a 2:1 ratio $FeCl_3/FeSO_4$ mixture may be dissolved in water (e.g., 10 mL). These two solutions may be mixed together, transferred into an autoclave (e.g., polytetrafluoroethylene (PTFE) lined steel autoclave), exposed to ammonia (e.g., 5 mL of 28% ammonia), and heated (e.g., about 90° C. for about six hours). The resulting mixture may be centrifuged to provide the nanoparticles, washed several times with water, and then vacuum dried (e.g., about 80° C.).

In the preceding two examples, the synthesized nanoparticles may be prepared using a melt compounder under a nitrogen atmosphere at an elevated temperature (e.g., 260° C.) while rotating (e.g., 60 rpm). Generally, when all of the nanoparticles are mixed together during the melt mixing, because of the lowering of the polarity mismatch, the nanoparticles may be preferentially localized in the polyvinylidene fluoride (PVDF) matrix phase. With the exemplary quantities and concentrations noted above, the two examples described above included about 3 wt. % MWCNTs and about 5 wt. % r-GO/Fe nanoparticles, respectively.

In various examples, the magnetic nanoparticles may be dispersed in a polymer matrix material. In some examples, conductive nanoparticles (e.g., MWCNTs) and/or reinforcing fibers (e.g., carbon fibers, glass fibers, synthetic fibers) may also be disperse in the polymer matrix material.

In various examples, the first material may be applied to a metallic substrate (e.g., aluminum or alloy thereof). In such examples, the first material may be applied as a slurry or paste by various deposition processes.

In various examples, the first material may be applied as one or more layers of a multilayered structure. For example, the method 300 may include forming a first layer formed of or including the first material, forming a second layer on the first layer formed of or including a second material, and forming a third layer on the second layer formed of or including a third material. In some examples, the second material may be different from the first material. In some examples, the third material may be the same as the first material. In some examples, the second material may include a polymer matrix with conductive nanoparticles dispersed therein. The various layers of the multilayer structure may be formed by various processes, such as various deposition processes.

At 314, the method 300 may optionally include tailoring the amounts or ratios of the magnetic nanoparticles and the conductive nanoparticles, if present, within the polymer matrix to provide a predetermined amount of absorption and reflection. In various examples, the method 300 may include forming the electromagnetic shield by forming a metallic substrate and forming a coating layer of the first material on the metallic substrate. In some examples, the method 300 may include forming the first material to include reinforcing fibers dispersed within the polymer matrix.

At 316, the method 300 may include providing an electromagnetic shield that includes the first material between a source of electromagnetic radiation and an object to be protected. In some examples, the EMI shield may be installed and electrically grounded onboard an aircraft to protect one or more electronic devices thereon.

The method 300 may end at 318.

The systems and methods disclosed herein provide various benefits over certain existing systems and methods. For example, the EMI shields discussed herein may provide substantial weight savings relative to existing metallic EMI shields. For example, an EMI shield comprising an ABS-based polymer matrix having magnetic nanoparticles dispersed therein may provide up to 60 percent weight savings over an equivalent EMI shield formed of aluminum. As another example, an EMI shield having a multilayer structure as described in reference to FIG. 1 and having a total thickness of about 1 mm may provide EMI shielding effectiveness from 10 dB to upto 150 dB over a wide range of frequencies (e.g., 1 MHz to 20,000 MHz). In some examples, one or more of the materials described herein may be applied as a coating layer on an existing EMI shield to enhance the EMI shielding capabilities thereof.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

As used herein, the term "substantially" denotes within 5% to account for manufacturing tolerances. Also, as used herein, the term "about" denotes within 5% to account for manufacturing tolerances.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An electromagnetic shield comprising a first material configured for reflection and/or absorption of electromagnetic radiation that includes a polymer matrix with magnetic nanoparticles dispersed therein, wherein the first material includes multiwalled carbon nanotube/manganese oxide nanoparticles, cross-linked partially reduced graphene oxide/iron oxide nanoparticles, or both dispersed in the polymer matrix.

2. The electromagnetic shield of claim 1, wherein the first material further includes conductive nanoparticles dispersed in the polymer matrix, and the amounts of the magnetic nanoparticles and the conductive nanoparticles within the polymer matrix are tailored to provide a predetermined amount of absorption and reflection, respectively.

3. The electromagnetic shield of claim 2, wherein the conductive nanoparticles include multiwalled carbon nanotubes, graphene, metallic nanoparticles, or combinations thereof.

4. The electromagnetic shield of claim 2, wherein the first material includes 0.1 wt. % to about 30 wt. % of the magnetic nanoparticles and 0.1 wt. % to about 30 wt. % of the conductive nanoparticles.

5. The electromagnetic shield of claim 1, wherein the electromagnetic shield is formed of the first material alone or in combination with one or more other polymer-based materials.

6. The electromagnetic shield of claim 1, wherein the electromagnetic shield includes a metallic substrate and the first material is a coating formed on the metallic substrate.

7. The electromagnetic shield of claim 1, wherein the first material includes reinforcing fibers dispersed within the polymer matrix.

8. The electromagnetic shield of claim 1, wherein the electromagnetic shield includes a multilayer structure having an outer layer, an inner layer, and a middle layer between the outer layer and the inner layer, wherein the outer layer and the inner layer are both formed of the first material and the middle layer is formed of a second material that includes a polymer matrix with conductive nanoparticles dispersed therein, and the outer layer is configured to be disposed facing a source of electromagnetic radiation.

9. The electromagnetic shield of claim 8, wherein the first material includes the conductive nanoparticles dispersed in the polymer matrix.

10. The electromagnetic shield of claim 1, wherein the electromagnetic shield is installed in an aircraft and electrically grounded.

11. A method of providing electromagnetic shielding, comprising:

forming an electromagnetic shield that includes a multilayer structure having an outer layer, an inner layer, and a middle layer between the outer layer and the inner layer, wherein the outer layer and the inner layer are both formed of a first material and the middle layer is formed of a second material, wherein the first material is configured for reflection and/or absorption of electromagnetic radiation and includes a polymer matrix with magnetic nanoparticles dispersed therein, wherein the second material includes a polymer matrix with conductive nanoparticles dispersed therein;

providing the electromagnetic shield between a source of electromagnetic radiation and an object, wherein the outer layer is disposed facing the source of electromagnetic radiation.

12. The method of claim 11, further comprising:

forming the first material to include the polymer matrix with the magnetic nanoparticles dispersed therein and the conductive nanoparticles dispersed therein; and tailoring the amounts of the magnetic nanoparticles and the conductive nanoparticles within the polymer matrix to provide a predetermined amount of absorption and reflection, respectively.

13. The method of claim 12, wherein the conductive nanoparticles include multiwalled carbon nanotubes, graphene, metallic nanoparticles, or combinations thereof dispersed within the polymer matrix.

14. The method of claim 11, further comprising forming the electromagnetic shield of the first material alone or in combination with one or more other polymeric-based materials.

15. The method of claim 11, further comprising forming the electromagnetic shield by forming a metallic substrate and forming a coating layer of the first material on the metallic substrate.

16. The method of claim 11, further comprising forming the first material to include reinforcing fibers dispersed within the polymer matrix.

17. The method of claim 11, further comprising forming the first material to include multiwalled carbon nanotube/manganese oxide nanoparticles and cross-linked partially reduced graphene oxide/iron oxide nanoparticles dispersed in the polymer matrix.

18. The method of claim 11, wherein the first material includes the conductive nanoparticles dispersed therein.

19. The method of claim 11, further comprising installing the electromagnetic shield in an aircraft and electrically grounding the electromagnetic shield while installed in the aircraft.

20. The method of claim 11, wherein the inner layer, the middle layer, and the outer layer each have a thickness of at least 100 nm.

* * * * *